United States Patent
Krijn et al.

(10) Patent No.: US 6,689,626 B2
(45) Date of Patent: Feb. 10, 2004

(54) FLEXIBLE SUBSTRATE

(75) Inventors: Marcellinus P. C. M. Krijn, Eindhoven (NL); Marinus J. J. Dona, Eindhoven (NL); Johannes M. M. Swinkels, Eindhoven (NL); Jeroen J. M. Vleggaar, Eindhoven (NL)

(73) Assignee: Koninklijke Philips Electronics N.V., Eindhoven (NL)

(*) Notice: Subject to any disclaimer, the term of this patent is extended or adjusted under 35 U.S.C. 154(b) by 202 days.

(21) Appl. No.: 09/902,221

(22) Filed: Jul. 10, 2001

(65) Prior Publication Data

US 2001/0050372 A1 Dec. 13, 2001

Related U.S. Application Data

(62) Division of application No. 09/351,380, filed on Jul. 13, 1999, now Pat. No. 6,281,525.

(30) Foreign Application Priority Data

Jul. 20, 1998 (EP) .............................................. 98202421

(51) Int. Cl.[7] ................................................ H01L 21/00

(52) U.S. Cl. .............................. 438/22; 438/24; 438/36; 438/37; 438/46; 438/47

(58) Field of Search ................................. 118/320, 319, 118/56, 52; 156/99; 427/240; 313/483, 484, 627, 634

(56) References Cited

U.S. PATENT DOCUMENTS

| | | | | |
|---|---|---|---|---|
| 3,771,855 A | * | 11/1973 | Burns .......................... | 350/160 |
| 4,526,818 A | * | 7/1985 | Hoshikawa et al. ........... | 428/1 |
| 5,200,238 A | * | 4/1993 | McArdle et al. ................ | 428/1 |
| 5,897,727 A | * | 4/1999 | Staral et al. ................... | 156/99 |

* cited by examiner

Primary Examiner—Long Pham
Assistant Examiner—Wai-Sing Louie

(57) ABSTRACT

The invention relates to a substrate comprising a glass sheet (1) having a thickness which is smaller than or equal to 0.1 mm, the glass sheet (1) being provided with a layer of a synthetic resin material (2) having a thickness which is smaller than or equal to that of the glass sheet (1). This substrate proves to be flexible. In addition, the substrate cracks less easily, so that it can be processed more readily. The substrate may be used, for example, in light-emitting devices, such as a poly-LED or PALC.

20 Claims, 1 Drawing Sheet

FLEXIBLE SUBSTRATE

CROSS REFERENCE TO RELATED APPLICATIONS

This is a divisional of application Ser. No. 09/351,380, filed Jul. 13, 1999 now U.S. Pat. No. 6,281,525.

The invention relates to a substrate comprising a glass sheet a main surface of which is provided with a synthetic resin layer. The invention also relates to a light-emitting device provided with such a substrate, and to a method of manufacturing such a substrate.

The English-language abstract of Japanese patent application JP-A-4-235527 describes a laminate of a relatively thick synthetic resin layer and a glass sheet. In JP-A-4-235527, a description is given of the application of the substrate in a light-emitting device for use in Liquid Crystal Displays. The known substrate has the drawback that it has a low flexibility, so that the range of applications is limited.

It is an object of the invention to provide a substrate which is flexible. To achieve this, the substrate in accordance with the invention is characterized in that the glass sheet has a thickness d which is smaller than or equal to 0.1 mm (d <0.1 mm), the synthetic resin layer on the main surface of the sheet having a thickness d' which is smaller than or equal to the thickness of the glass sheet (d'≦d). It has been found that such a sheet is flexible and that, in practice, bending with radii of curvature ranging from 3 to 4 cm is possible.

Also the processability, such as cutting and breaking of the substrate, has been improved because, during processing, the material cracks less easily at the edge. This effect is already obtained if a central part of the main surface is free of the synthetic resin layer.

A light-emitting device in accordance with the invention may be, for example, a poly-LED. Such a device is described in "LEDs" by R. Friend in Physics World, November 1992, pp. 42–46. Customary poly-LED displays comprise a substrate of a synthetic resin and have the favorable property that they are flexible. Such synthetic resin substrates, however, generally are permeable to oxygen and water. This limits the service life and the shelf life of the display. The flexible substrate in accordance with the invention obviates this drawback in that the glass sheet is non-permeable to oxygen and water.

Another example of a light-emitting device in accordance with the invention is a Plasma Addressed Liquid Crystal display. Such a device is described in U.S. Pat. No. 5,596,431.

The known display comprises a sandwich structure of two glass sheets. On a first glass sheet are deposited parallel, transparent column electrodes, customarily referred to as "ITO" columns because indium-tin oxides are commonly used as the column material on which a layer of a color filter material is deposited.

A second glass sheet comprises parallel, closed plasma channels which correspond to rows of the display and cross all ITO columns, each channel being filled with a low-pressure ionizable gas, such as helium, neon or argon, and including cathode and anode structures which extend in the longitudinal direction of the channel to ionize the gas and generate a plasma. The channels are closed by a thin glass sheet. An electro-optical material, such as a liquid-crystal (LC) material, is situated between the first and the second glass sheet.

In such displays, the glass sheet is very thin (30–80 μm) and cracks easily, thus causing rejects during the manufacture. Cracking usually starts at the edge. It has been found that the development of cracks can be reduced by using the substrate in accordance with the invention. Also the processability is improved.

The substrate in accordance with the invention can also be used in electrochromic devices.

A very favorable application of a light-emitting device is a light source in accordance with the invention, which is characterized in that it is embodied so as to be a sandwich of 2 substrates between which there is space which is filled with a suitable gas mixture and spacers.

The sub-claims define advantageous embodiments of the invention.

These and other aspects of the invention will be apparent from and elucidated with reference to the embodiment(s) described hereinafter, which constitute(s) a non-limitative example.

Figure 1:
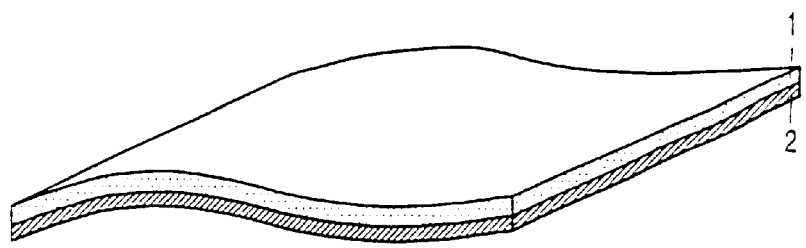
FIG. 1 shows a side view of a laminated substrate.

FIG. 1 is a side view of a laminated substrate comprising a glass layer 1 and a synthetic-resin layer 2. Such a laminate may alternatively include various glass layers provided with synthetic resin layers. In the plan view of a substrate shown in FIG. 2, only the edge is provided with a synthetic resin layer 2.

Figure 2:
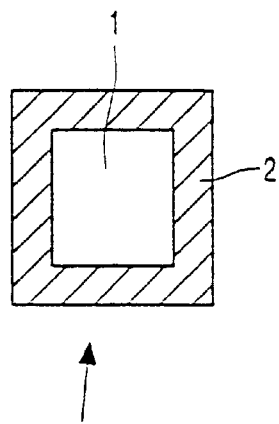
FIG. 2 shows a plan view of a glass substrate.

The substrate shown in FIGS. 1 and 2 is a laminate which can be obtained, for example by providing a glass sheet 1 having a thickness of, for example, 60 to 80 μm with a suitable resin, for example a polyurethane resin, by means of spin coating. Examples of suitable polyurethane resins are NeoRez R-970, R-972, R-980 by Zeneca Resins in Waalwijk (NL). Good results were also obtained by using a 2p-resin (order no. 1 322 000 40034) which is commercially available from Philips (Oss, NL).

It is possible to improve the adhesion by subjecting the glass to a pretreatment with a silane. Silanes are compounds of the form $X_3Si$-RY, where X is a so-called hydrolyzable group which bonds to the glass, Y is an organic group which combines with the synthetic resin, and R is a residual group (generally an alkyl group).

An example of such a silane is: $CH_2$=CHSi($OCH_2CH_2OCH_3$)$_3$ This silane is known under the trade name Z-6082 and is made by "Dow Corning Corporation".

Silanes can be dissolved in a solvent (for example water to which an acid has been added). A glass surface may be immersed in this solution (spinning or spraying is also possible). After evaporation of the solvent and, if necessary, a temperature treatment, the process is complete.

In an example, the substrate was obtained in the following manner. The 2p resin 2 having a thickness ranging from 5 to 8 μm was cured in air for 2 minutes while simultaneously being exposed to UV radiation. The curing process was subsequently repeated in an $N_2$ atmosphere. Also glass sheets 1 of 30 μm can be provided in this manner with a synthetic resin. Instead of a 2p resin use can be made, for example, of a polyurethane resin.

A glass substrate having a thickness of 30 μm and dimensions of 64×64 mm was provided in the manner described above with a polyurethane resin layer having a thickness of 5 μm. The uncoated side of the glass substrate is provided, by spin coating from an aqueous suspension, with an anode layer of a highly conductive polyethylene dioxythiophene (supplied by Bayer) having a surface resistance of 300 Ohm/square. This layer was dried at 100° C. for 1 minute and subsequently calcined at 200° C. for 2 minutes. Next, a layer of poly[2-methoxy-5-(2-ethylhexyloxy)-p-phenylene] (MEH-PPV) was spun in a thickness of 150 nm. A cathode layer Yb having a thickness of 150 nm was sputtered onto the the MEH-PPV layer. Subsequently, a 300 nm thick layer of copper and a 50 nm thick layer of silver was sputtered as a bonding layer. Next, a eutectic alloy of In/Sn (52:48, melting point 118° C.) was provided in a layer thickness of 30 µm at a processing temperature of 125° C. Said layer sufficiently protects the poly-LED obtained against the action of moisture and oxygen. The poly-LED obtained can be bent to a radius of curvature of 1 cm without the glass being subject to fracture. When a voltage of 9 V is applied between the anode layer and the cathode layer, a light emission of 50 Cd/m$^2$ is attained.

Figure 3:
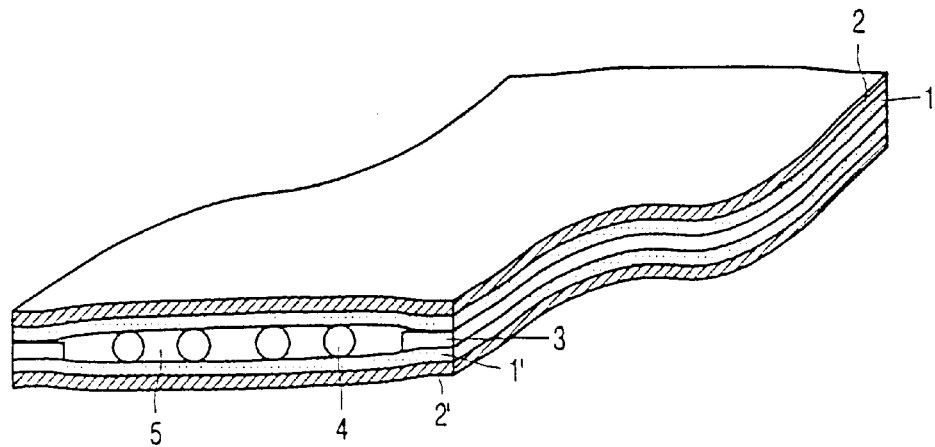
FIG. 3 shows a side view of a flexible flat light source.

FIG. 3 is a side view of a flexible, flat light source. Two glass surfaces 1, 1', which are provided with synthetic resin layers 2, 2', respectively, are attached to each other at the edges. The sides provided with the synthetic resin layers 2, 2' face the outside faces of the device. At least one of the glass surfaces 1, 1' is provided with a phosphor coating.

At the location of the central part of the device, the substrates are separated from each other by means of spacers 4, so that the substrates enclose a space 5. This space 5 is filled, for example, with a mixture of an inert gas and, for example, mercury vapor. The side of the substrate facing said space 5 may be provided with a phosphor which converts UV-light to visible light (not shown).

Electrodes 3 are situated at the side faces of the device. If the device is in operation, a current flows from the one electrode to the other electrode through the space 5.

Briefly summarized, the invention relates to a flexible substrate which comprises a glass sheet 1 having a thickness which is equal to or smaller than 0.1 mm, which glass sheet is provided with a synthetic resin layer 2, the thickness of the synthetic resin layer being equal to or smaller than the thickness of the glass sheet.

It has been found that this substrate is flexible. In addition, it cracks less easily, so that it can be processed more readily.

The substrate can be used, inter alia, in light-emitting devices, such as poly-LED or PALC.

Particularly small radii of curvature can be obtained if the synthetic resin layer is pretensioned by applying it to the glass sheet 1 at a temperature above room temperature, preferably at a temperature ranging between 100 and 400° C. After cooling to room temperature, the glass sheet 1 is stressed in tension. When the resultant laminate is bent in such a way that the glass sheet 1 is oriented on the inside of the curvature and the synthetic resin layer 2 is oriented on the outside of the curvature, the synthetic resin layer 2 proves to provide a very good protection against the formation of cracks in the glass sheet 1 on the outside of the curvature. By virtue of this very good protection against cracking in the glass sheet 1, it is possible to subject the laminate to further bending and hence obtain a smaller radius of curvature than would have been possible otherwise.

It is noted that the above embodiments serve to explain the invention, but that the invention is not limited thereto. People skilled in the art will doubtlessly be capable of designing many alternative embodiments without surpassing the scope of protection of the appended claims. The reference signs in brackets used in the claims must not be interpreted as limiting the scope of the claims. The term "comprise" does not exclude the presence of steps or means other than those mentioned in the claims.

What is claimed is:

1. A method of manufacturing a laminate comprising a glass sheet (1) on which a synthetic resin layer (2) is provided, characterized in that the glass sheet (1) has a thickness d which is smaller than or equal to 0.1 mm (d≦0.1 mm), the synthetic resin layer (2) on the main surface of the glass sheet having a thickness d' which is smaller than or equal to the thickness of the glass sheet (d≦d').

2. A method as claimed in claim 1, characterized in that the synthetic resin layer (2) is applied to the glass sheet (1) at an increased temperature.

3. A method of manufacturing a laminate of a glass sheet and a synthetic resin, comprising; providing a major surface of a glass sheet of a thickness d of not greater than 0.1 mm with a synthetic resin layer of a thickness d' not greater than the thickness d.

4. The method of claim 3, including curing the synthetic resin layer.

5. The method of claim 4, wherein the synthetic resin layer is cured in air while being exposed to ultraviolet radiation.

6. The method of the claim 5, wherein synthetic resin layer has a thickness ranging from 5 to 8 micrometers.

7. The method of claim 4, wherein the synthetic resin layer has a thickness ranging from 5 to 8 micrometers.

8. The method of claim 3, wherein the synthetic resin layer has a thickness ranging from 5 to 8 micrometers.

9. The method of claim 6, further including curing the synthetic resin layer in $N_2$.

10. The method of claim 5, further including curing the synthetic resin layer in $N_2$.

11. The method of claim 4, including applying the synthetic resin layer by spin coating to the major surface of the glass sheet.

12. The method of claim 3, including applying the synthetic resin layer by spin coating to the major surface of the glass sheet.

13. The method of claim 4, wherein the synthetic resin layer is applied to the major surface of the glass sheet at a temperature above room temperature.

14. The method of claim 3, wherein the synthetic resin layer is applied to the major surface of the glass sheet at a temperature above room temperature.

15. The method of claim 14, wherein the synthetic resin layer is applied to the major surface of the glass sheet at a temperature ranging between 100 and 400 degrees C.

16. The method of claim 6, wherein the synthetic resin layer is applied to the major surface of the glass sheet at a temperature ranging between 100 and 400 degrees C.

17. The method of claim 5, wherein the synthetic resin layer is applied to the major surface of the glass sheet at a temperature ranging between 100 and 400 degrees C.

18. The method of claim 4, wherein the synthetic resin layer is applied to the major surface of the glass sheet at a temperature ranging between 100 and 400 degrees C.

19. A light-emitting device comprising a substrate formed by the method of claim 3.

20. A method of manufacturing a light-emitting device, comprising:

forming a first substrate by providing a major surface of a glass sheet of a thickness d of not greater than 0.1 mm with a synthetic resin layer of a thickness d' not greater than the thickness d and providing a first electrode on another surface of the glass sheet; disposing the first substrate and a second substrate having a second electrode on a surface facing the first electrode with a spacer therebetween so that a space is formed between the first substrate and the second substrate; and filling the space with a gas mixture capable of emitting light when a voltage is applied to across the electrodes.

* * * * *